United States Patent [19]
Clere et al.

[11] Patent Number: 4,807,179
[45] Date of Patent: Feb. 21, 1989

[54] METHOD AND DEVICE FOR RECORDING ANALOG PARAMETERS ON A STATIC DIGITAL MEMORY

[75] Inventors: Jean-Michel Clere, Bretigny-sur Orge; Dominic Lebrun, Savigny-sur-Orge, both of France

[73] Assignee: Etat Francais, Paris, France

[21] Appl. No.: 721,480

[22] Filed: Apr. 9, 1985

[30] Foreign Application Priority Data

Dec. 19, 1984 [FR] France ................. 84 19407

[51] Int. Cl.$^4$ .................. G06F 15/74; G11B 5/02
[52] U.S. Cl. .............................. 364/900; 360/5
[58] Field of Search ... 364/200 MS File, 900 MS File; 360/5; 371/12-14, 66

[56] References Cited

U.S. PATENT DOCUMENTS

| | | | |
|---|---|---|---|
| 4,409,670 | 10/1983 | Herndon et al. | 360/5 X |
| 4,558,379 | 12/1985 | Hütter et al. | 360/5 X |
| 4,646,241 | 2/1987 | Ratchford et al. | 364/424 |

*Primary Examiner*—Emanuel S. Kemeny
*Assistant Examiner*—David L. Clark
*Attorney, Agent, or Firm*—Parkhurst, Oliff & Berridge

[57] ABSTRACT

A method and apparatus are provided for data storage in, for example, a black box for an aircraft. A static digital memory is divided into three portions, A, B and C. Data is read into successive sequential portions of wrap-around memory portion A. When an interrupt signal is received, e.g., due to a crash, the memory part A address to which the last data was input is entered into memory part B, along with an indication of which parameter was entered at that address. Data then is stored in sequential portions of memory part C until the end thereof is reached. To read the data, the last address to which data was entered in part A is read from memory part B, data is read from the position immediately following that entry to the end of part A, then from the beginning of part A through to the last entry. Data then is read from memory part C. The resultant data represents a period of time from shortly before, e.g., 0.3 ms, to some time, e.g., a couple of seconds, after the interrupt signal.

8 Claims, 3 Drawing Sheets

METHOD AND DEVICE FOR RECORDING ANALOG PARAMETERS ON A STATIC DIGITAL MEMORY

BACKGROUND OF THE INVENTION

The technical area involved in this invention is that of static digital recorders capable of recording analog parameters and intended to function in severe recording conditions (intense accelerations, high compression of air in front of moving objects, vibrations, extreme temperatures, high altitude or hyperbaria).

Magnetic accident recorders mounted on aircraft, called "black boxes" or "crash detectors", are alredy well-known. Some record data in analog form, and other in digital form.

One drawback encountered in these systems is the inability to record parameters at the moment of the accident itself, because the magnetic recorder stops working at the moment when the accident causes the intense accelerations.

The same thing happens with electro-magnetic phenomena detectors using entirely digital recorders with static memory. There the data is pre-processed by several microprocessors. This type of system was not designed as an accident recorder as such. It is not designed to operate in a rapidly changing dynamic shock or impact environment.

One such recorder is described in the periodical "Safe" (Vol. 14 No. 1, p. 13 to 20, 1984). This system is intended to be mounted on an anthropomorphic dummy used for set ejection testing. It allows recording of numerous parameters (16, 48 or 64) but requires one or more 16 input multiplexers. The sampling interval is at most 2,000 HZ, and the system has the drawback of not allowing for simultaneous measurement of several parameters. Finally, recording is not automatic since it requires the presence of an external electrical signal. In addition, this system is not designed for complete recording of the status of the parameters before, that is to say under completely normal conditions, during and after the accident. In fact, it is activated externally at an arbitrarily chosen moment when the parameters begin to vary abnormally or practically at the moment of ejection.

SUMMARY OF THE INVENTION

One of the purposes of this invention is to produce a recorder capable of recording at any given moment all the variations in parameters before, during and after this moment, with known and constant recording periods.

Another purpose of this invention is to produce a completely autonomous recorder with automatic activation.

Another purpose of the invention is to produce a recorder capable of recording variations in several parameters simultaneously and in syne.

Another purpose of the invention is to produce a recording system with high speed input data acquisition (3.3 kHZ) and with high performance recording period (for example, on the order of 7 seconds for three parameters each comprising three components).

Finally another goal of the invention is to produce a recording system which can function in severe dynamic conditions.

To achieve these goals, the invention provides a procedure for recording in a static memory the variations over time of n analog parameters, characterized in that one sequentially:
- uses a first part A of the total memory to record these n parameters,
- detects a trigger signal during the recording in part A,
- stores in another part B of the memory data concerning the status of the recording at the time of the interrupt signal,
- resumes recording of the n parameters in the remaining part C of the memory.

Another characteristic of the invention is that the first part A of the memory is wrapped around so that once the end of it is reached, recording continues back at the beginning of memory A.

By using this technique, at whatever moment the interruption signal, i.e., the accident, occurs, there remains stored in memory A a recording of constant and known length of the variations in the parameters before the accident, as well as a recording of known and constant length in memory C of the variations in parameters during and after the accident.

When the data is retrieved and interpreted, these recording characteristics allow a precise and rational determination of the circumstances and causes of the accident.

According to a preferred embodiment, the trigger signal can occur automatically as soon as certain components of certain parameters attain values higher than threshold values, or the signal can be activated from outside the recording system.

Preferably, the data stored in memory B can be the address of the point where recording left off in memory A, that is Ad, at the moment of triggering, and/or the nature of the data being recorded at the moment of triggering.

Preferably, data retrieval begins by retrieval of memory B to locate the memory address Ad where data collection stopped upon detection of the trigger signal, then proceeds to data retrieval from memory A at address Ad+1, continues to the end of memory A, and then goes back to the beginning of memory A and continues up to adress Ad. Finally, retrieval covers the C part of the memory.

For implementation of this procedure, the device designed according to the invention includes:
- n multiplexers with m inputs, with these m inputs corresponding to m components defining each parameter,
- n memory blocks, as well as their n addressing circuits, intended to receive data from the multiplexers, together comprising parts A, B and C as heretofore defined,
- a clock controlling the addressing circuits of the memory blocks and the multiplexers in sync, this arrangement allowing description of the overall position of the n parameters with regard to the component being measured at any given moment.

Preferably with this device any addressing should take place on the upper leading edge of the clock pulse, while threshold detecting, as well as any addressing and writing to memory B, will take place on the downward leading edge of the clock pulse so as not to waste clock pulse for these operations.

In a practical embodiment of this device, each memory storage block will be defined by i data bits and k address bits, i and k being integral powers of two.

The B part of the memory preferably will contain:

a certain number of bits representing a part of the storage address Ad.

a certain number of bits representing the identity of the component being recorded at the moment of the interrupt signal, a certain number of bits representing the identity of the parameters represented by the storage block.

BRIEF DESCRIPTION OF THE DRAWINGS

Other characteristics of the invention will become apparent from the following description wherein the invention is detailed in a non-restrictive embodiment with reference to the drawings, in which.

DETAILED DESWCRIPTION OF THE INVENTION

Figure 1:
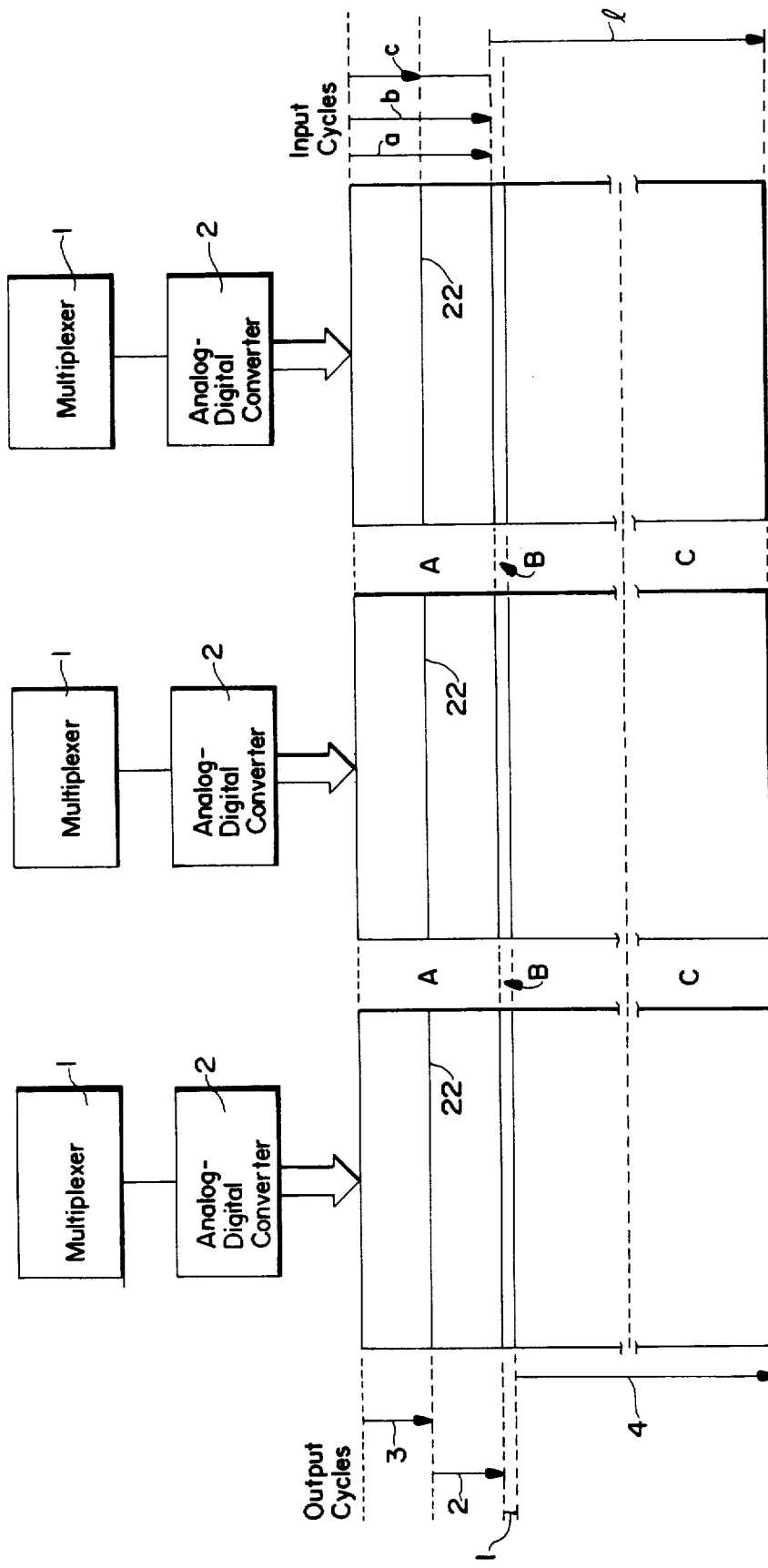
FIG. 1 is a block diagram illustrating the contents of the memory storage blocks and the data input (a, b, c, d) and retrieval (1, 2, 3, 4) systems.

The preferred embodiment herein described measures three parameters, e.g., the acceleration of the aircraft, on three axes, e.g., x, y, z. The device therefore comprises three storage strings corresponding to the three parameters to be recorded, as shown in FIG. 1. Of course, additional parameters may be recorded by adding additional storage strings.

Figure 2:
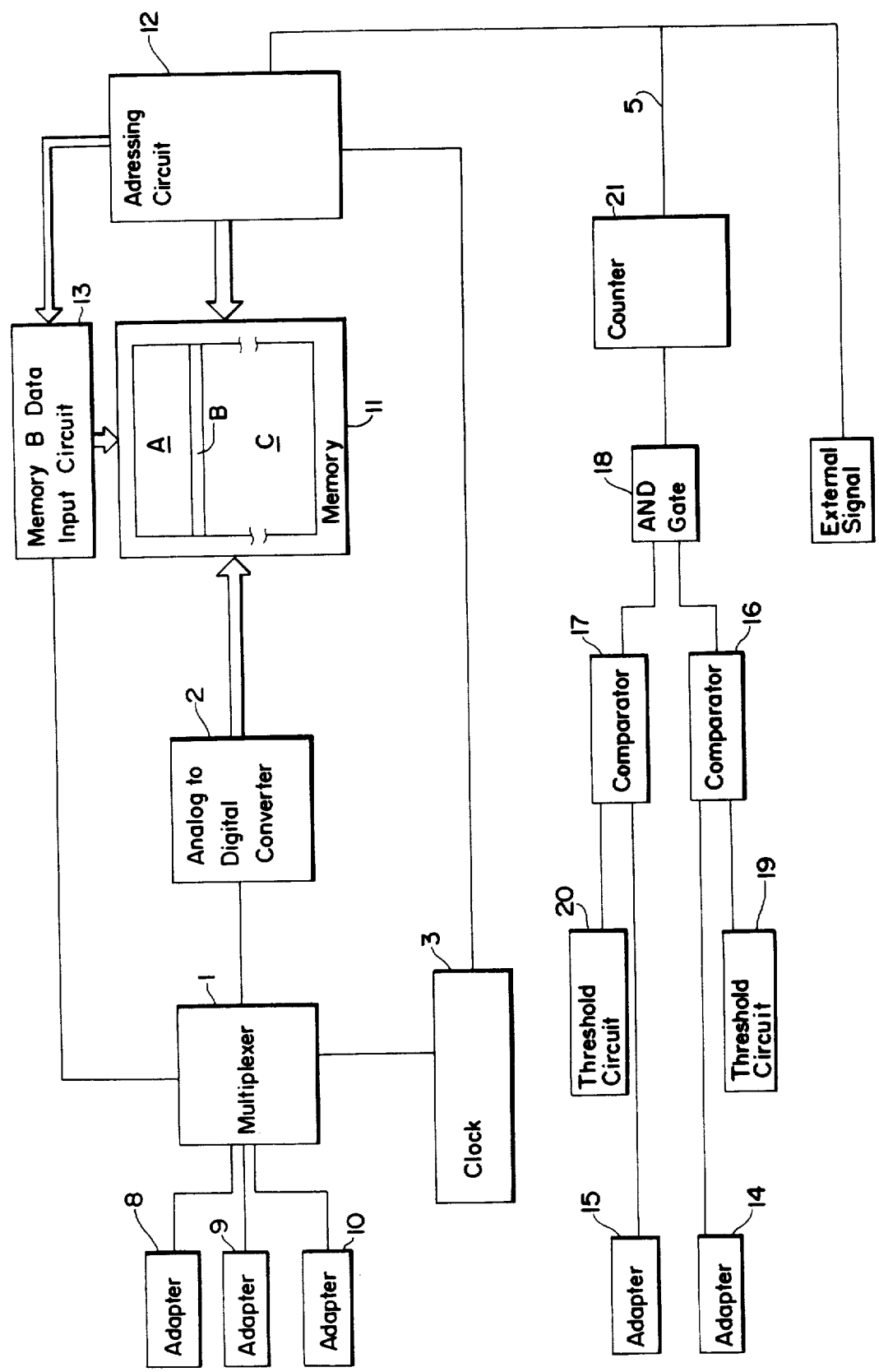
FIG. 2 represents a schematic diagram of a preferred embodiment of the invention.

As best seen in FIG. 2, each of these strings comprises:

an impedance, gain and frequency adapter (8), (9) and (10) for each of three sensor components,
a three-input multiplexer (1),
an analog-to-digital converter (2),
a non-volatile static digital storage module (11) with a 64K capacity,
an addressing circuit (12) for this memory (11),
a memory B data input circuit (13),
a clock (3), and
a trigger system with an output (5), comprising
one common adapter (14) for component x,
one common adapter (15) for component z,
two comparators (16) and (17),
and AND gate (18),
two threshold setting circuits (19) and (20),
a counter (21).

The adapter outputs (8), (9) and (10) are connected to the multiplexer (1). The multiplexer (1) is connected to the converter (2), whose 8 bit output is connected to the storage data bus of the memory (11). The multiplexer (1) is sequenced to present the inputs from each of the adapters (8), (9) and (10) to the converter (2) in a cyclical fashion.

The memory (11) is addressed cyclically by the addressing circuit (12) connected to its address bus (as indicated by input cycles a, b in FIG. 1), and the clock (3) ensures synchronization of the addressing circuit (12) and the multiplexer (1), preferrably on the leading edge of a clock sync pulse.

The interrupt system uses comparators (16) and (17) to compare the values x and z obtained by means of adapters (14) and (15) with threshold values generated by circuits (19) and (20). The two comparators are connected to a counter (21) via an AND gate (18), whose purpose is to determine if the values of x and z attain or exceed the threshold values over a given interval of time. If this condition is met, the interrupt signal is delivered at the counter output (5) and directed toward the addressing circuit (12). The interrupt signal causes a skip to the memory B, (represented by the skip from input cycle c to d in FIG>(1), and then data input circuit (13) transfers its input data onto the circuit data bus (11) between two samplings for storage in the memory B.

Cyclically, as before, the memory (11) then acquires the component values on the leading edge of a clock sync pulse and stores them from the beginning of the part C of the memory and continues on to the end of storage capacity (input cycle D).

The recording is intended to store, for each parameter, three components x,y,z, via multiplexer (1) and the analog-to-digital converter (2).

Coding is done in 8 bits and the sampoling frequency given the clock circuit (3) is 10 kHZ, with each component thus being sampled at a frequency of 3.3. kHZ and with each memory block (11) containing 64K. Thus, the interval of time represented by the data stored in the recorder corresponds to 21,845 sampling values per component.

Once activated, the storage module cyclically acquires data present on each input line and records it successively on the first 4096 words of the memory storage block, that is the first sixteenth of the memory storage block, representing the above mentioned A memory.

This loop corresponds to a recording of phenomena for about 0.4 seconds before interruption. Each component is sampled every 0.3 ms.

The address Ad will be defined by 12 bits, assuming this number is the necessary bits number to address 4096 bytes.

This address will be split by circuits (13) into three portions, namely, four low order bits, four medium order bits and four high order bits. Each circuit (13) then stores four of these bits in the 8 bit memory word at address 4096 (memory part B). Thus, part of the total 12 bit address Ad is stored in each 8 bit memory part B of each memory block. Each circuit (13) also stores in each memory word (6) two bits identifying its corresponding storage block or string and two bits identifying the component represented by the word at address Ad at the moment of triggering, those two bits are identical in the three memory parts B, assuming the memory blocks are all sequenced simultaneously by the clock. Identification of the component represented at the address Ad is necessary because the length of memory A is not divisible by the number of components being recorded and thus each memory address will represent a different component for each successive loop. Thus, with three components, address Ad has the same parameter as at Ad+1 in the previous cycle.

To retrieve data, one begins at the word recorded at address 4,096 (memory B) of each memory block (output cycle 1).

The memory block B identification code allows one to reset the memory address bits and retrieve the address Ad (22) of the data input at the time of the triggering (see FIG. 1). Similarly, one knows the parameters corresponding to each memory block and the component recorded at the address Ad.

Retrieval of data from storage begins at Ad+1 and continues up to address 4,095 (output cycle 2, FIG. 1)

then returns to address 0 to read data stored up to Ad (22) (output cycle 3), then skips to 4,097, in memory C to continue on up to 65,536, the last address in memory (output cycle 4).

If one wishes to retrieve only the variation in a single component of a parameter one proceeds as indicated above and retrievesw only one memory word out of three, while realizing that memory locations Ad and Ad+1 contain the same component.

Figure 3:
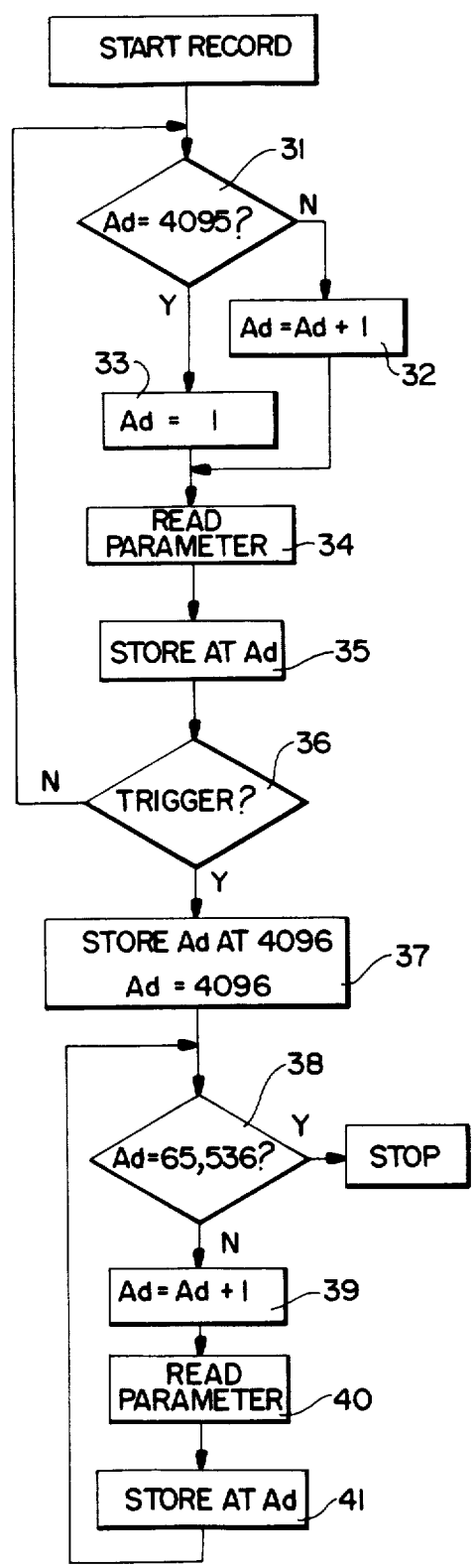
FIG. 3 is a flow-chart of a method of operating the device of FIGS. 1 and 2 during data recording.
Figure 4:
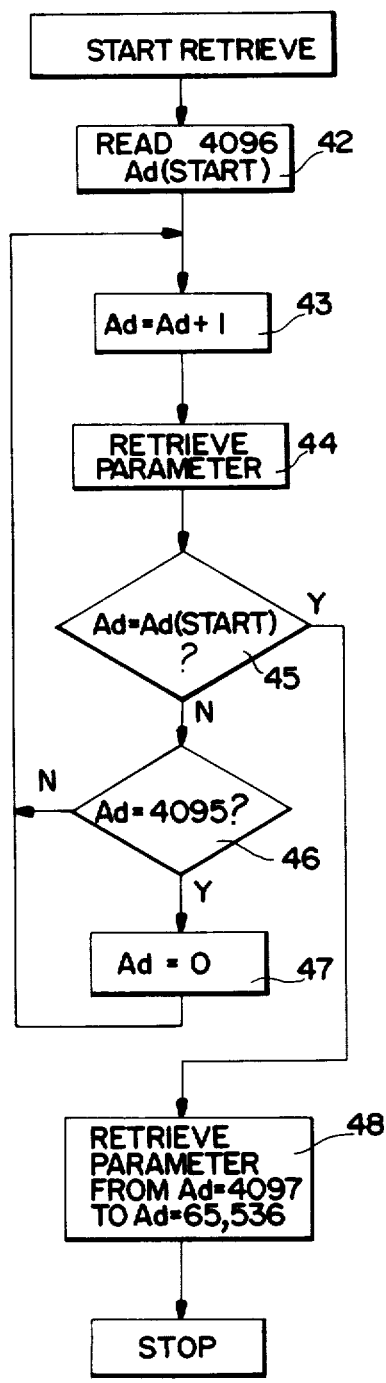
FIG. 4 is a flow-chart of a method of operating the device of FIGS. 1 and 2 during data retrieving.

The recording and retrieveing method of the present invention can be summarized with reference to FIGS. 3 and 4.

In FIG. 3, blocks 31-36 are executed cyclically to record data in memory A. In decision block 31, it is determined if the address Ad is equal to 4095 indicating the end of memory A. If so, control is transferred to block 33 where address Ad is set equal to one, thereby wrapping the cyclic recording operation around to the first entry of memory A. If not, control is transferred to block 32 where address Ad is incremated by one.

In block 34, the appropriate component of the parameter is read by multiplexer 1 and analog—to—digital converter 2 (FIG. 2), and in block 35, the component value is stored in memory A at address Ad. In block 36, it is determined whether a trigger signal is present on line 5 (FIG. 2). If not, control is returned to decision block 31 to repeat the cycle. If so, control is transferred to block 37 where the value of address Ad is stored in address 4096 (memory B) of the memory block.

Blocks 38-41 are then cyclically performed to store the values of the parameter components in memory locations 4097 through 65,536 (memory C). Recording is then stopped.

Referring to FIG. 4, when retrieving information, memory address 4096 is read to determine the starting address Ad(start), within memory A. Blocks 43-47 are then cyclically performed to retrieve the parameter components stored in memory A beginning with the memory address following address Ad(start), and continuing through the end of memory A, then beginning at the first entry of memory A, and continuing through address Ad(start). After the entirety of memory A is read, control is transferred to block 48 where the entirety of memory C is read from address 4097 to address 65,536. Data retrieving is then stopped.

This invention covers not only the particular embodiment described hereinabove but also their equivalents.

Thus it should be noted that although the embodiment described hereinabove involves an eight bit processor, the invention as claimed and described in general terms also covers devices involving 16, 32 or more bit processors, if the state of the art so permits.

This system as designed can be used for any inflight-testing or aboard land vehicles subjected to major mechanical or thermal shocks.

The recorder is capable of recording brief phenomena with a rapid rate of data acquisition and can be adapted not only to all accidents or dummy ejection conditions, but to all severe recording conditions and, particularly with an independent power supply, can function entirely autonomously.

On the basis of data variations in parameters recorded over known and constant intervals before, during and after the accident, it is possible to interpret these findings so as to understand the potential causes of such behavior of the system and eventually remedy them.

This system can record parameters before, during and after an accident involving a land, sea, or air vehicle, and the parameters can express acceleration, speed, forces or pressures occurring on any point of the vehicle or of one of its occupants.

This is a very general purpose system which can record all parameters capable of being measured electronically. Thus these data can come not only from acceleration gauges, but from pressure or temperature gauges or other parameters obtained from measurement or analytical devices such as, for example, the rotational speed of a machine, rate of acquistion or others.

Finally, since this recording system is capable of activating at any given moment while storing input data on variations in parameters before this given moment for some milliseconds, then during and after this given moment for some seconds, it is perfectly suited to applications involving commercial airplanes, land or air vehicles used for public transport, for the transport of hazardous materials and to other applications.

What is claimed is:

1. A method for recording and retrieving variations over time of analog parameters in a static digital memory comprising:

allocating a memory into n memory blocks corresponding to n parameters, n being a positive integer, and allocating each block into first, second and third parts;

loading at a frequency f and cyclically storing values of m components representing each analog parameter in sequential portions of the first part of a respective memory block, m being a positive integer, and, if a last sequential portion of said first part of said respective memory block is reached, continuing storing the m components in said first part of said respective memory block by wrapping around to a first sequential portion of said first part of the respective memory block, and storing the m components in the first and subsequent sequential portions of said first part of the respective memory block;

detecting a starting signal;

upon detection of said starting signal, loading and storing in the second part of each memory block data including at least an address Ad of the last loaded sequential portion of the first part of the memory block before detection of the starting signal;

loading and storing at the frequency f, the m components in sequential portions of the third part of each memory block up to the last portion of the memory block;

retrieving recorded data by:

retrieving from the second part of each memory block the address Ad of the last stored sequential protion of the first part of each memory block;

retrieving data from the sequential portions of the first part of each memory block starting at an address Ad+1, and continuing up to the last sequential portion of said first part of each memory block;

retrieving data from the first portion of said first part of each memory block and from sequentially following portions of the first part of each memory block up to and including the address Ad retrieved from the second part of each memory block;

retrieving data from a first portion and sequentially following portions of the third part of each memory block up to a last sequential portion of each respective memory block.

2. A method according to claim 1, further comprising the step of generating said starting signal whenever at least one parameter value exceeds a predetermined threshold value for a predetermined time interval.

3. A method according to claim 1, further comprising the step of generating said starting signal with an external command signal.

4. The method according to claim 1, further comprising the step of generating said starting signal when each of a plurality of parameter values exceeds corresponding predetermined threshold values for predetermined time intervals.

5. The method according to claim 1, wherein said step of loading the second part of each memory block is performed just after detection of the starting signal and before a subsequent loading of data, the timing of said subsequent loading of data being determined by the frequency f.

6. The method according to claim 1, wherein the data stored in the second part of each memory includes:
- a part of the address Ad of the portion of the first part of the memory block being addressed when the starting signal is detected;
- the identity of the component stored at the address Ad and
- the identity of the parameter allocated to the respective memory block.

7. The method according to claim 1, wherein m and n equal 3, and wherein the metho further comprises the steps of generating the starting signal when two of the components of any one of the parameters simultaneously exceed the corresponding threshold value for a predetermined time interval.

8. The method according to claim 6, wherein:
- the address Ad comprises 12 bits, divided into four low order bits, four middle order bits and four high order bits;
- the data loaded in the second part of a first memory block comprising eight bits including the four low order bits, two of said four low order bits identifying the component loaded at the address Ad of said first part of said first memory block and two of said low order bits identifying the parameter loaded in said first memory block;
- the data loaded in the second part of the second memory block comprises eight bits including the four middle order bits, two of said middle order bits identifying the component loaded at the address Ad of said first part of said second memory block and two of said middle order bits identifying the parameter loaded in said second memory block; and
- wherein the data loaded in the second part of the third memory block comprises eight bits including the high order bits, two of said four high order bits identifying the component loaded at the address Ad of said first part of said third memory block and two of said four high order bits identifying the parameter loaded in the third memory block.

* * * * *